United States Patent
Kanaya

(10) Patent No.: US 8,786,829 B2
(45) Date of Patent: Jul. 22, 2014

(54) EXPOSURE APPARATUS, EXPOSURE METHOD, AND DEVICE MANUFACTURING METHOD

(75) Inventor: Yuho Kanaya, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1021 days.

(21) Appl. No.: 12/463,730

(22) Filed: May 11, 2009

(65) Prior Publication Data

US 2009/0284717 A1 Nov. 19, 2009

Related U.S. Application Data

(60) Provisional application No. 61/071,696, filed on May 13, 2008.

(51) Int. Cl.
| | | |
|---|---|---|
| *G03B 27/58* | (2006.01) | |
| *G03B 27/52* | (2006.01) | |
| *G03B 27/42* | (2006.01) | |
| *G03B 27/32* | (2006.01) | |
| *G03F 7/20* | (2006.01) | |
| *G03B 27/54* | (2006.01) | |

(52) U.S. Cl.
CPC ........ *G03F 7/70341* (2013.01); *G03F 7/70775* (2013.01)
USPC ................... 355/72; 355/30; 355/53; 355/67; 355/77

(58) Field of Classification Search
USPC ........... 355/30, 52, 53, 55, 67–71, 72–74, 77; 430/5, 8, 22, 30, 311, 320; 356/399–401; 250/492.1, 492.2, 250/492.22, 548
See application file for complete search history.

(56) References Cited

U.S. PATENT DOCUMENTS

| | | | |
|---|---|---|---|
| 4,780,617 A | 10/1988 | Umatate et al. | |
| 5,196,745 A | 3/1993 | Trumper | |
| 5,448,332 A | 9/1995 | Sakakibara et al. | |
| 5,610,715 A | 3/1997 | Yoshii et al. | |
| 5,646,413 A | 7/1997 | Nishi | |
| 5,969,441 A | 10/1999 | Loopstra et al. | |

(Continued)

FOREIGN PATENT DOCUMENTS

| | | |
|---|---|---|
| EP | 1 621 933 A2 | 2/2006 |
| JP | A 2003-28673 | 1/2003 |

(Continued)

OTHER PUBLICATIONS

International Search Repot and Written Opinion issued for corresponding international application PCT/JP2009/059235, Issued on Nov. 4, 2009, 11 pp, ISA: European Patent Office.

(Continued)

*Primary Examiner* — Toan Ton
*Assistant Examiner* — Christina Riddle
(74) *Attorney, Agent, or Firm* — Oliff PLC

(57) ABSTRACT

In an exposure apparatus of a liquid immersion exposure method, a liquid immersion area is formed on the upper surface of a wafer by liquid supplied in a space formed with a projection optical system, and on a moving table holding the wafer, a plurality of encoder heads is placed. Of the plurality of encoder heads, a controller measures positional information of the moving table within an XY plane using an encoder head which is outside a liquid immersion area. This allows a highly precise and stable measurement of positional information of the moving table.

20 Claims, 8 Drawing Sheets

(56) References Cited

U.S. PATENT DOCUMENTS

| | | |
|---|---|---|
| 6,208,407 B1 | 3/2001 | Loopstra |
| 6,590,634 B1 | 7/2003 | Nishi et al. |
| 6,611,316 B2 | 8/2003 | Sewell |
| 6,778,257 B2 | 8/2004 | Bleeker et al. |
| 6,819,425 B2 | 11/2004 | Kwan |
| 7,023,610 B2 | 4/2006 | Ohtsuki et al. |
| 7,025,498 B2 | 4/2006 | Del Puerto |
| 7,102,729 B2 | 9/2006 | Renkens et al. |
| 7,161,659 B2 | 1/2007 | Van Den Brink et al. |
| 7,238,931 B2 | 7/2007 | Nabeshima et al. |
| 7,253,875 B1* | 8/2007 | Luttikhuis et al. ............... 355/30 |
| 7,256,871 B2 | 8/2007 | Loopstra et al. |
| 7,289,212 B2 | 10/2007 | Kwan |
| 7,292,312 B2 | 11/2007 | Loopstra et al. |
| 7,333,174 B2 | 2/2008 | Koenen et al. |
| 7,348,574 B2 | 3/2008 | Pril et al. |
| 7,349,069 B2 | 3/2008 | Beems et al. |
| 7,362,446 B2 | 4/2008 | Van Der Pasch et al. |
| 7,405,811 B2 | 7/2008 | Beems et al. |
| 2002/0109823 A1* | 8/2002 | Binnard et al. .................. 355/53 |
| 2003/0025890 A1 | 2/2003 | Nishinaga |
| 2004/0263846 A1* | 12/2004 | Kwan ........................... 356/399 |
| 2005/0018162 A1* | 1/2005 | Leenders et al. ................ 355/67 |
| 2005/0094125 A1* | 5/2005 | Arai ............................... 355/72 |
| 2005/0128461 A1 | 6/2005 | Beems et al. |
| 2006/0007419 A1* | 1/2006 | Streefkerk et al. ............... 355/53 |
| 2006/0023178 A1 | 2/2006 | Loopstra et al. |
| 2006/0023194 A1* | 2/2006 | Loopstra et al. ................ 355/72 |
| 2006/0103816 A1* | 5/2006 | Belfroid et al. ................. 355/30 |
| 2006/0103832 A1* | 5/2006 | Hazelton et al. ................ 355/72 |
| 2006/0139660 A1* | 6/2006 | Patrick Kwan ............... 356/614 |
| 2006/0227309 A1* | 10/2006 | Loopstra et al. ................ 355/53 |
| 2007/0052976 A1 | 3/2007 | Pril et al. |
| 2007/0076218 A1 | 4/2007 | Van Empel et al. |
| 2007/0195296 A1 | 8/2007 | Van Der Pasch et al. |
| 2007/0223007 A1 | 9/2007 | Klaver et al. |
| 2007/0256471 A1 | 11/2007 | Loopstra et al. |
| 2007/0263191 A1 | 11/2007 | Shibazaki |
| 2007/0263197 A1* | 11/2007 | Luttikhuis et al. .............. 355/55 |
| 2007/0288121 A1 | 12/2007 | Shibazaki |
| 2008/0043212 A1 | 2/2008 | Shibazaki |
| 2008/0068568 A1 | 3/2008 | Ebihara et al. |
| 2008/0074681 A1 | 3/2008 | Loopstra et al. |
| 2008/0088843 A1 | 4/2008 | Shibazaki |
| 2008/0094592 A1 | 4/2008 | Shibazaki |
| 2008/0094593 A1 | 4/2008 | Shibazaki |
| 2008/0094604 A1 | 4/2008 | Shibazaki |
| 2008/0100819 A1* | 5/2008 | Onvlee et al. ................... 355/75 |
| 2008/0105026 A1 | 5/2008 | Loopstra et al. |
| 2008/0106722 A1 | 5/2008 | Shibazaki |
| 2008/0218713 A1 | 9/2008 | Shibazaki |
| 2008/0240501 A1 | 10/2008 | Van Der Wijst et al. |
| 2008/0246936 A1 | 10/2008 | Loopstra et al. |
| 2009/0004580 A1 | 1/2009 | Kanaya |
| 2009/0190110 A1* | 7/2009 | Shibazaki ....................... 355/53 |
| 2009/0284716 A1* | 11/2009 | Kanaya ........................... 355/30 |

FOREIGN PATENT DOCUMENTS

| | | |
|---|---|---|
| WO | WO 01/35168 A1 | 5/2001 |
| WO | WO 2005/010611 A2 | 2/2005 |
| WO | WO 2005/074014 A1 | 8/2005 |
| WO | WO 2007/083758 A1 | 7/2007 |

OTHER PUBLICATIONS

Dec. 23, 2011 Office Action issued in Chinese Patent Application No. 200980117083.X (with English translation).

Chinese Patent Office, 2$^{nd}$ Notification of Office Action issued Jun. 21, 2012 in Chinese Patent Application No. 200980117083.X w/English-language Translation.

* cited by examiner

EXPOSURE APPARATUS, EXPOSURE METHOD, AND DEVICE MANUFACTURING METHOD

CROSS-REFERENCE TO RELATED APPLICATIONS

This non-provisional application claims the benefit of Provisional Application No. 61/071,696 filed May 13, 2008, the disclosure of which is hereby incorporated herein by reference in its entirety.

BACKGROUND OF THE INVENTION

1. Field of the Invention

The present invention relates to exposure apparatus, exposure methods, and device manufacturing methods, and more particularly to an exposure apparatus and an exposure method used in a lithography process to manufacture microdevices such as a semiconductor device, and a device manufacturing method which uses the exposure apparatus or the exposure method.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper), or a projection exposure apparatus by a step-and-scan method (a so-called scanning stepper (which is also called a scanner) is mainly used.

However, semiconductor devices will lead to higher integration in the future, and accompanying this, it is certain that the circuit pattern which should be formed on the wafer will be finer, and further improvement of the position detection precision of wafers and the like will be required in the exposure apparatus which is the mass-production apparatus for semiconductor devices.

For example, in U.S. Patent Application Publication No. 2006/0227309, an exposure apparatus is disclosed which employs a liquid immersion exposure method having an encoder type sensor (an encoder head) installed on a substrate table. In this kind of an exposure apparatus, liquid is supplied in a space between a substrate and an optical system so as to form a liquid immersion area, and the liquid immersion area may sometimes move from an area on the substrate to an area on the substrate table by the movement of the substrate table. In this case, there was a risk of the encoder head not functioning properly such as an output abnormality being generated in the encoder head, due to (the liquid forming) the liquid immersion area which covers the upper part of the encoder head (or the encoder head being buried in the liquid of the liquid immersion area).

SUMMARY OF THE INVENTION

According to a first aspect of the present invention, there is provided an exposure apparatus, the apparatus comprising: a movable body which holds a mounted object and substantially moves along a predetermined plane; a liquid supply device which supplies liquid on a surface of at least one of the object and the movable body on which the object is mounted; a pattern generation device including an optical system which has liquid supplied to a space formed with the surface of at least one of the object and the movable body, irradiates an energy beam on the object via the optical system and the liquid, and forms a pattern on the object; and a measurement system which has a plurality of encoder heads each placed on a surface of the movable body, and out of the plurality of encoder heads, measures positional information of the movable body, based on measurement values of encoder heads located outside a liquid immersion area formed by the liquid.

According to this apparatus, the measurement system measures the positional information of the movable body within the predetermined plane, based on the measurement values of the encoder head outside the liquid immersion area of a plurality of encoder heads. This keeps the encoder head which may not function properly due to being located in the liquid immersion area as in output abnormality being generated from being used, which allows a measurement of the positional information of wafer stage WST to be performed with high accuracy in a stable manner.

According to a second aspect of the present invention, there is provided a device manufacturing method, the method including: exposing an object using the exposure apparatus of the present invention; and developing the object which has been exposed.

According to a third aspect of the present invention, there is provided an exposure method in which an energy beam is irradiated on an object via an optical system and liquid, and a pattern is formed on the object, the method comprising: a measurement process in which a plurality of encoder heads that are placed on a surface where the object is mounted of a movable body that substantially moves along a predetermined plane, positional information of the movable body is measured based on measurement values of encoder heads that face a grating section placed in parallel with the predetermined plane and are located outside a liquid immersion area formed with the liquid.

According to this method, the positional information of the movable body within the predetermined plane is measured based on measurement values of the encoder head outside the liquid immersion area of a plurality of encoder heads. This keeps the encoder head which may not function properly being located in the liquid immersion area as in output abnormality being generated from being used, which allows a measurement of the positional information of wafer stage WST to be performed with high accuracy in a stable manner.

According to a fourth aspect of the present invention, there is provided a device manufacturing method, the method including: a process in which a pattern is formed on the object by the exposure method of the present invention; and a process in which the object on which the pattern has been formed is developed.

BRIEF DESCRIPTION OF THE DRAWINGS

In the accompanying drawings.

DESCRIPTION OF THE EMBODIMENTS

A First Embodiment

Hereinafter, a first embodiment of the present invention will be described, with reference to FIGS. 1 to 5.

Figure 1:
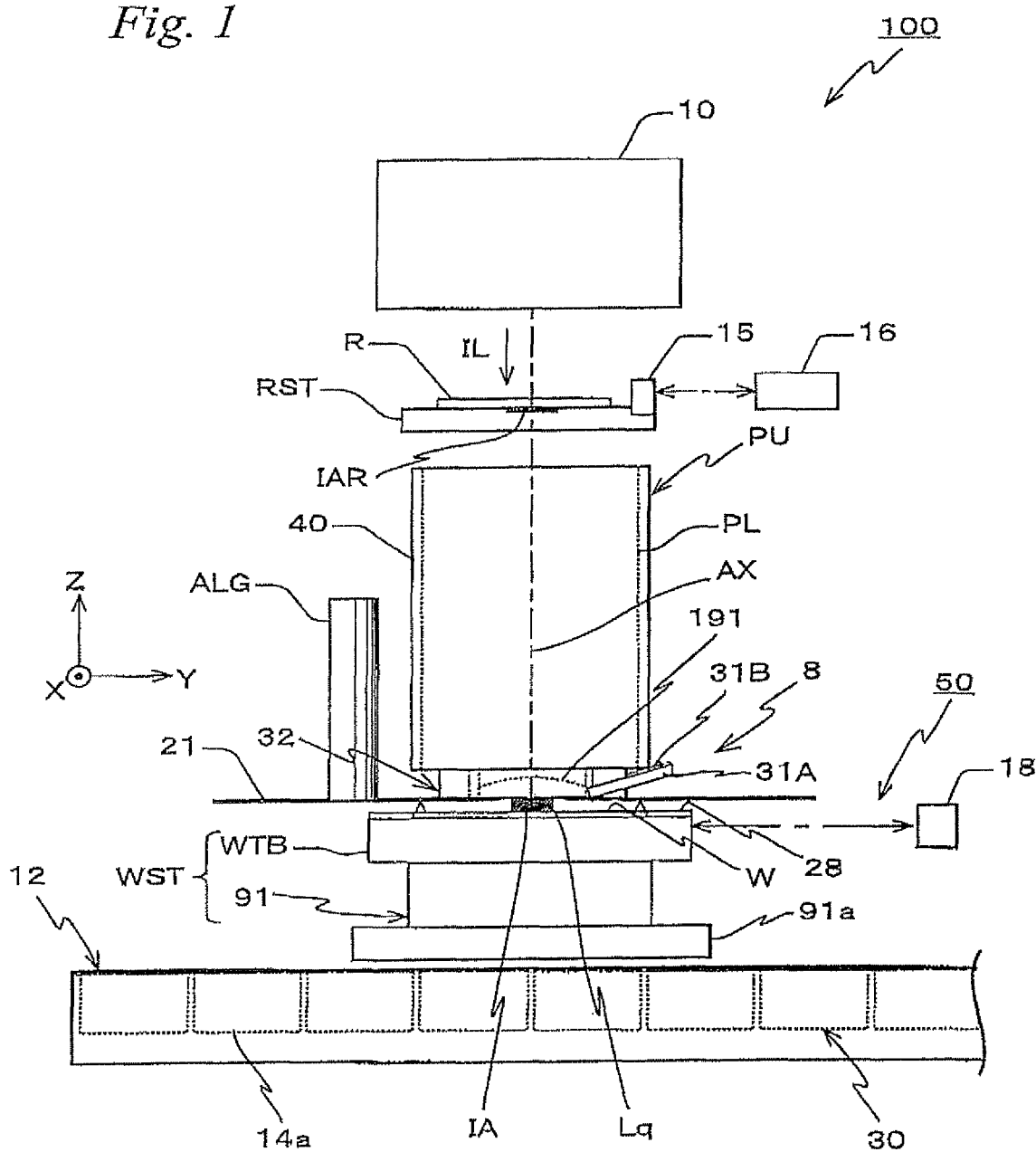
FIG. 1 is a view that schematically shows a configuration of an exposure apparatus of a first embodiment.

FIG. 1 shows a schematic configuration of an exposure apparatus 100 in the first embodiment. Exposure apparatus 100 is a projection exposure apparatus of the step-and-scan method, namely the so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as $\theta x$, $\theta y$, and $\theta z$ directions, respectively.

Exposure apparatus 100 is equipped with an illumination system 10, a reticle stage RST holding reticle R, a projection unit PU, a local liquid immersion device 8, a wafer stage device 50 including wafer stage WST on which a wafer W is mounted, a control system for these parts and the like.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/0025890 and the like. Illumination system 10 illuminates a slit-shaped illumination area IAR, which is set on reticle R with a reticle blind (a masking system), by an illumination light (exposure light) IL with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive section 11 (not shown in FIG. 1, refer to FIG. 4) that includes a linear motor or the like, and reticle stage RST is also drivable in a scanning direction (in this case, the Y-axis direction, which is the lateral direction of the page surface in FIG. 1) at a predetermined scanning speed.

The positional information (including position information (hereinafter also referred to as $\theta z$ rotation quantity) in the $\theta z$ direction) of reticle stage RST in the XY plane (movement plane) is constantly detected, for example, at a resolution of around 0.25 nm by a reticle laser interferometer (hereinafter referred to as a "reticle interferometer") 16, which irradiates a measurement beam on a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction) shown in FIG. 1. Incidentally, the encoder system which is disclosed in, for example, U.S. Patent Application Publication No. 2007/0288121 and the like, can be used instead of, or together with reticle interferometer 16 to measure the positional information of reticle R at least in directions of three degrees of freedom.

Projection unit PU is placed below (−Z side) reticle stage RST in FIG. 1, and is held by a mainframe (metrology frame) which configures a part of a body (not shown). Projection unit PU has a barrel 40, and a projection optical system PL consisting of a plurality of optical elements held by barrel 40. As projection optical system PL, for example, a dioptric system is used, consisting of a plurality of lenses (lens elements) that has been disposed along optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area IAR, illumination light IL that has passed through reticle R which is placed so that its pattern surface substantially coincides with a first plane (an object plane) of projection optical system PL forms a reduced image of the circuit pattern (a reduced image of a part of the circuit pattern) of reticle R formed within illumination area IAR, via projection optical system PL, in an area (exposure area) IA conjugate to illumination area IAR on wafer W whose surface is coated with a resist (a sensitive agent) and is placed on a second plane (an image plane) side of projection optical system PL. And by the synchronous drive of reticle stage RST and wafer stage WST, reticle R relatively moves in the scanning direction (the Y-axis direction) with respect to illumination area TAR (illumination light IL) while wafer W relatively moves in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern is generated on wafer W according to illumination system 10 and projection optical system PL, and then by the exposure of the sensitive layer (resist layer) on wafer W with illumination light IL, the pattern is formed on wafer W.

Incidentally, the main frame can be one of a gate type frame which is conventionally used, and a hanging support type frame disclosed in, for example, U.S. Patent Application Publication No. 2008/0068568 and the like.

In exposure apparatus 100 of the embodiment, a local liquid immersion device 8 is installed to perform exposure by a liquid immersion method. Local liquid immersion device 8 includes a liquid supply device 5, a liquid recovery device 6 (both of which are not shown in FIG. 1, refer to FIG. 4), a liquid supply pipe 31A, a liquid recovery pipe 31B, a nozzle unit 32 and the like. As shown in FIG. 1, nozzle unit 32 is supported in a suspended state by a mainframe (not shown) holding projection unit PU, so that the periphery of the lower end portion of barrel 40 that holds an optical element closest to the image plane side (the wafer W side) constituting projection optical system PL, in this case, a lens (hereinafter also referred to as a tip lens) 191, is enclosed. In the embodiment, nozzle unit 32 is set so that its lower end surface is on a substantially flush surface with the lower end surface of tip lens 191. Further, nozzle unit 32 is equipped with a supply opening and a recovery opening of a liquid Lq, a lower surface to which wafer W is placed facing and at which the recovery opening is arranged, and a supply flow channel and a recovery flow channel that are connected to a liquid supply pipe 31A and a liquid recovery pipe 31B respectively.

Figure 4:
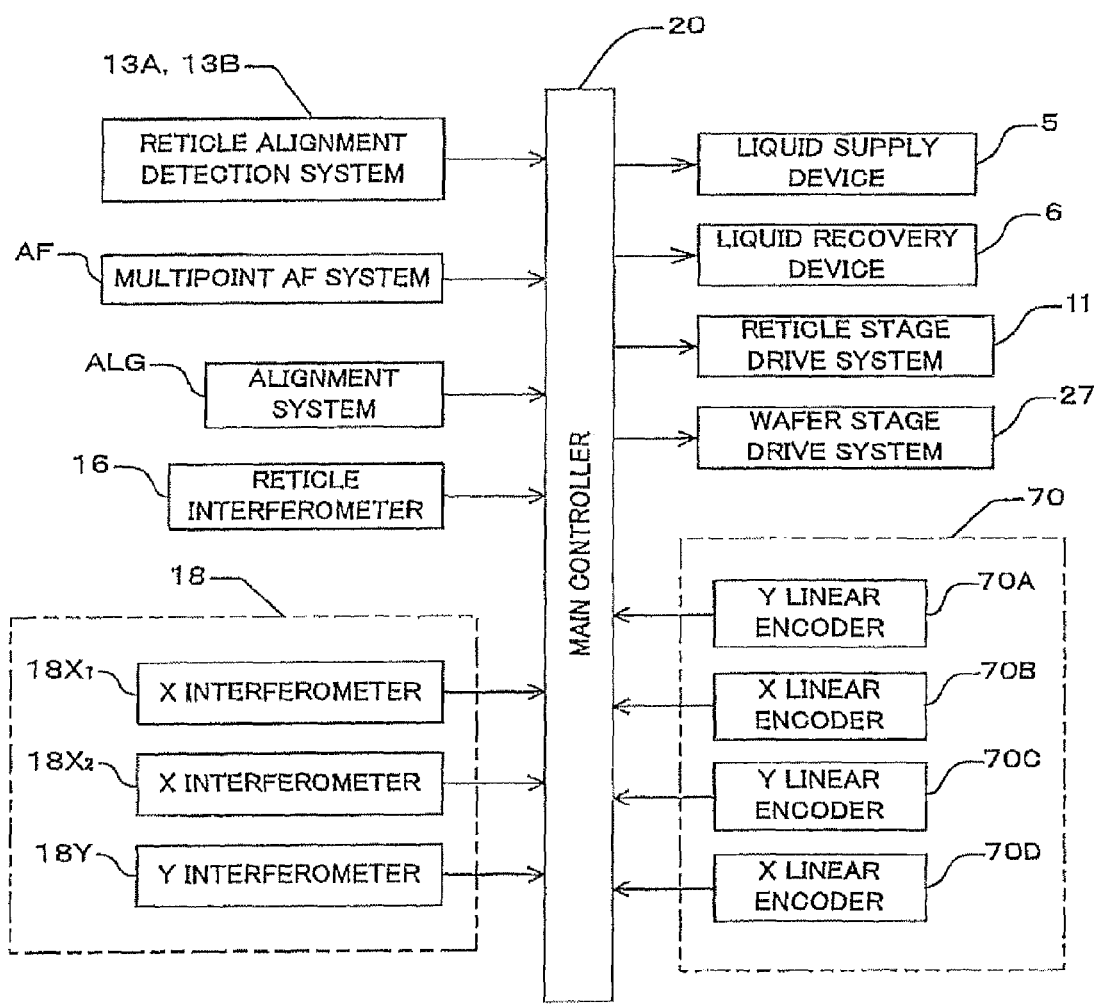
FIG. 4 is a block diagram showing the main configuration of the control system related with the stage control in the exposure apparatus in FIG. 1.

Liquid supply pipe 31A connects to liquid supply device 5 (refer to FIG. 4), and liquid recovery pipe 31B connects to liquid recovery device 6 (refer to FIG. 4). In this case, in liquid supply device 5, a tank to store the liquid, a compression pump, a temperature controller, a valve for controlling the flow amount of the liquid, and the like are equipped. In liquid recovery device 6, a tank to store the liquid which has been recovered, a suction pump, a valve for controlling the flow amount of the liquid, and the like are equipped.

Main controller 20 controls liquid supply device 5 (refer to FIG. 4), and supplies liquid between tip lens 191 and wafer W (or the upper surface (a plate 28 to be described later) of wafer table WTB on which wafer W is mounted) via liquid supply pipe 31A, and controls liquid recovery device 6 (refer to FIG. 4), and recovers liquid from between tip lens 191 and wafer W via liquid recovery pipe 31B. During the operations, main controller 20 controls liquid supply device 5 and liquid recovery device 6 so that the quantity of liquid supplied constantly equals the quantity of liquid which has been recovered. Accordingly, in the space between tip lens 191 and wafer W, a constant quantity of liquid Lq is held constantly replaced, and by this, a liquid immersion area ALq (for example, refer to FIG. 2) is formed.

In the embodiment, as the liquid described above, pure water (hereinafter, it will simply be referred to as "water" besides the case when specifying is necessary) that transmits the ArF excimer laser light (light with a wavelength of 193 nm) is to be used incidentally, refractive index n of the water with respect to the ArF excimer laser beam is around 1.44, and in the water the wavelength of illumination light IL is 193 nm×1/n, shortened to around 134 nm.

In the periphery on the −Z side end of barrel 40, for example, a scale plate 21 is placed parallel to the XY plane, at a height substantially flush with a surface on the lower end of barrel 40. In the embodiment, scale plate 21 consists of a rectangular plate which has a circular opening in which the −Z end of barrel 40 is inserted and a circular opening in which the −Z end of an alignment system is inserted formed in a part of the plate, and is supported by suspension from a body (not shown). In the embodiment, scale board 21 is supported by suspension from a main frame (not shown) (metrology frame) which supports projection unit PU. On the lower surface (a surface on the −Z side) of scale plate 21, as a two-dimensional grating, a two-dimensional reflection grating RG (refer to FIG. 3) is formed, which consists of a grating of a predetermined pitch whose periodic direction is in the Y-axis direction, such as, a grating of 1 μm, and a grating of a predetermined pitch whose periodic direction is in the X-axis direction, such as, a grating of 1 μm. This diffraction grating RG covers the movement range of wafer stage WST.

Wafer stage device 50 is equipped with a stage base 12 supported almost horizontally by a plurality of (for example, three or four) vibration isolation mechanisms (omitted in the drawings) on the floor surface, a wafer stage WST placed on stage base 12, a wafer stage drive system 27 (only a part of the system shown in FIG. 1, refer to FIG. 4), and a measurement system which measures the position of wafer stage WST. The measurement system is equipped with an encoder system 70, a wafer laser interferometer system 18 and the like shown in FIG. 4. Incidentally, encoder system 70 and wafer laser interferometer system 18 will be further described later in the description.

Stage base 12 is made of a member having a tabular form, and the degree of flatness of the upper surface is extremely high and serves as a guide surface when wafer stage WST moves. Inside stage base 12, a coil unit is housed, including a plurality of coils 14a placed in the shape of a matrix with the XY two-dimensional direction serving as a row direction and a column direction.

As shown in FIG. 1, wafer stage WST has a stage main section 91, and a wafer table WTE which is placed above stage main section 91 and is supported in a non-contact manner with respect to stage main section 91 by a Z tilt drive mechanism (not shown). In this case, wafer table WTB is supported in a non-contact manner by z tilt drive mechanism by adjusting the balance of the upward force (repulsion) such as the electromagnetic force and the downward force (gravitation) including the self-weight at three points, and is also finely driven in directions of three degrees of freedom, which are the Z-axis direction, the θx direction, and the θy direction. At the bottom of stage main section 91, a slider section 91a is arranged. Slider section 91a has a magnetic unit made up of a plurality of magnets arranged two-dimensionally within the XY plane, a housing to house the magnetic unit, and a plurality of air bearings arranged in the periphery of the bottom surface of the housing. The magnet unit configures a planar motor 30 which uses the drive of a Lorentz electromagnetic force as disclosed in, for example, U.S. Pat. No. 5,196,745, along with the coil unit previously described. Incidentally, as planar motor 30, the drive method is not limited to the method using the Lorentz force electromagnetic force, and a planar motor by a variable reluctance drive system can also be used.

Wafer stage WST is supported by levitation above stage base 12 by a predetermined clearance, such as around several μm, by the plurality of air bearings described above, and is driven in the X-axis direction, the Y-axis direction, and the θz direction by planar motor 30. Accordingly, wafer table WTB (wafer W) is drivable with respect to stage base 12 in directions of six degrees of freedom. Incidentally, wafer stage WST can be driven in directions of six degrees of freedom by planar motor 30.

In the embodiment, a main controller 20 controls the magnitude and direction of current supplied each of the coils 14a configuring the coil unit. Wafer stage drive system 27 is configured, including planar motor 30 and the Z tilt drive mechanism previously described. Incidentally, planar motor 30 is not limited to a motor using a moving magnet method, and can be a motor using a moving coil method. Or, as planar motor 30, a magnetic levitation type planar motor can be used. In this case, the air bearing previously described does not have to be arranged. Further, wafer table WTB can be finely movable in at least one of the X-axis direction, the Y-axis direction, and the Z-axis direction. More specifically, wafer stage WST can be configured by a rough/fine movement stage.

Figure 2:
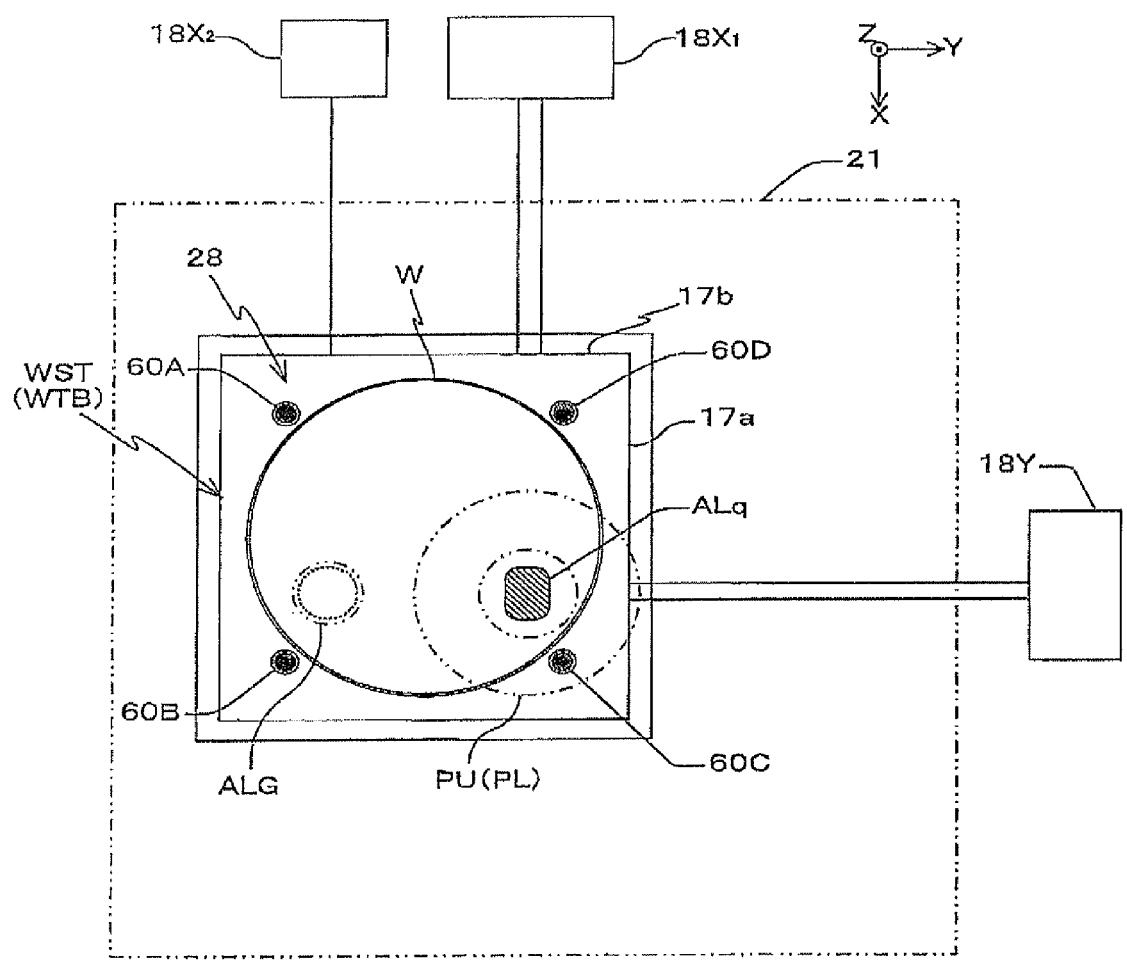
FIG. 2 is a view to explain a placement of an encoder head and an interferometer.

On wafer table WTB, wafer W is mounted via a wafer holder (not shown), and is fixed by a chuck mechanism (not shown), such as, for example, vacuum suction (or electrostatic adsorption). On a surface on the +Y side (the +Y edge surface) and a surface on the −X side (the −X edge surface) of wafer table WTB, respectively, mirror-polishing is applied, and reflection surfaces 17a and 17b which are used in wafer laser interferometer system to be described later are formed as shown in FIG. 2. On the outer side of the wafer holder (mounting area of the wafer), as shown in FIG. 2, a plate (a liquid repellent plate) 28 is arranged that has a circular opening slightly larger than the wafer holder formed in the center, and also has a rectangular outer shape (contour). A liquid repellent treatment against liquid Lq is applied to the surface of plate 28 (a liquid repellent surface is formed). Incidentally, plate 28 is set so that its entire surface or a part of its surface becomes flush with the surface of wafer W.

Encoder system 70 measures positional information (including information on the θz rotation quantity) of wafer stage WST in the XY plane. Now, a configuration and the like of encoder system 70 will be described in detail.

Figure 3:
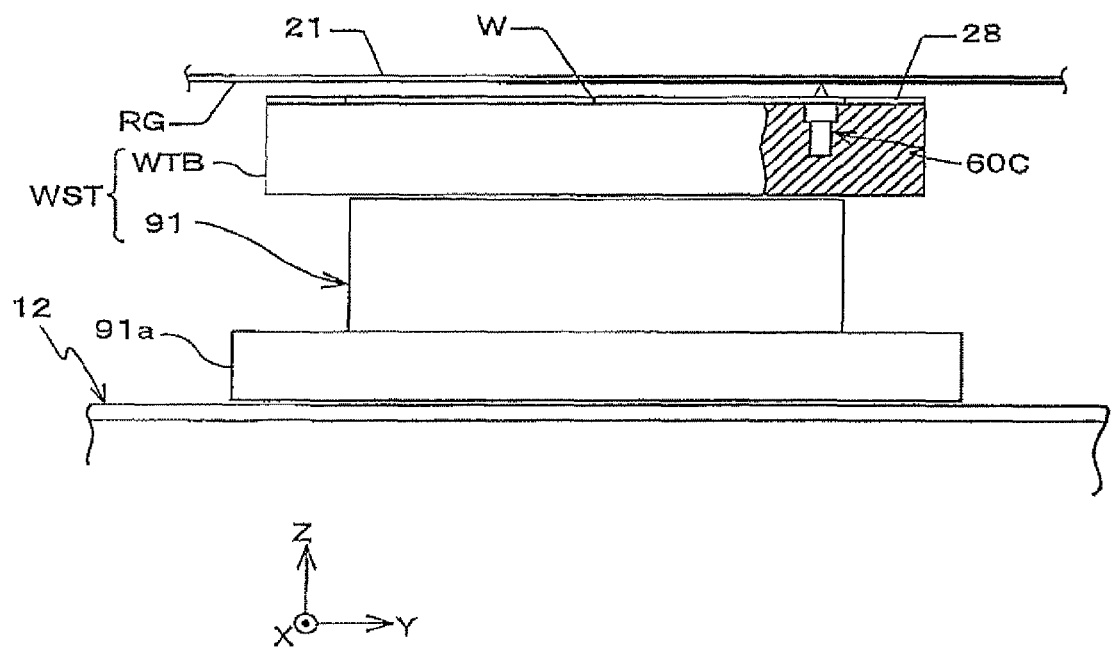
FIG. 3 is an enlarged view where a part of the wafer stage in FIG. 1 is fractured.

On wafer table WTB, as shown in a planar view in FIG. 2, an encoder head thereinafter, shortly referred to as a head, as needed) 60A, 60B, 60C, and 60D are placed in the four corners, respectively. Heads 60A to 60D are placed at positions so that the separation distance between heads adjacent in the X-axis direction or the Y-axis direction is sufficiently greater than the width of liquid immersion area ALq. These heads 60A to 60D are fitted, respectively, inside holes of a predetermined depth in the Z-axis direction which have been formed in wafer table WTB as shown in FIG. 3, with head 60C taken up as a representative.

A pair of heads 60A and 60C, which is located on one of the diagonal lines on the upper surface of wafer table WTB, are heads (Y heads) whose measurement direction is in the Y-axis direction. Further, a pair of heads 60B and 60D, which is located on the other diagonal line on the upper surface of wafer table WTB, are heads (X heads) whose measurement direction is in the X-axis direction. As each of the heads 60A to 60D, heads having a configuration similar to the head disclosed in, for example, U.S. Pat. No. 7,238,931, International Publication No. 2007/083758 and the like are used. In heads with such a configuration, since the optical path lengths of the measurement beams are extremely short, the influence of air fluctuation can mostly be ignored. However, in the embodiment, the light source and a photodetector are arranged external to each head, or more specifically, inside (or outside) stage main section 91, and only the optical system is arranged inside of each head. And the light source, the photodetector, and the optical system are optically connected via an optical fiber (not shown). In order to improve the positioning precision of wafer table WTB (fine movement stage), air transmission of a laser beam and the like can be performed between stage main section 91 (rough movement stage) and wafer table WTB (fine movement stage) (hereinafter shortly referred to as a rough/fine movement stage), or a configuration can be employed where a head is provided in stage main section 91 (rough movement stage) so as to measure a position of stage main section 91 (rough movement stage) using the head and to measure relative displacement of the rough/fine movement stage with another sensor.

Y heads 60A and 60C configure Y linear encoders (hereinafter appropriately shortened to "Y encoders" or "encoders") 70A and 70C (refer to FIG. 4), respectively, which measure the position of wafer stage WST in the Y-axis direction by irradiating measurement beams (measurement lights) on scale plate 21 and receiving diffraction beams from the grating whose periodic direction is the Y-axis direction formed on the surface (lower surface) of scale plate 21. Further, X heads 60B and 60D configure X linear encoders (hereinafter appropriately shortened to "encoders") 70B and 70D (refer to FIG. 4), respectively, which measure the position of wafer stage WST in the X-axis direction by irradiating measurement beams on scale plate 21 and receiving diffraction beams from the grating whose periodic direction is the X-axis direction formed on the surface of scale plate 21.

The measurement values of each of the encoders 70A to 70D are supplied to main controller 20 (refer to FIG. 4). Main controller 20 obtains positional information (including information on the θz rotation quantity) of wafer table WTB (water stage WST) in the XY plane, based on measurement values of at least three encoders (more specifically, at least three encoders which output effective measurement values) facing the lower surface of scale plate 21 on which diffraction grating RG is formed.

Further, in exposure apparatus 100 of the embodiment, the position of wafer stage WST can be measured with wafer laser interferometer system (hereinafter referred to as "wafer interferometer system") 18 (refer to FIG. 4), independently from encoder system 70.

As shown in FIG. 2, wafer interferometer system 18 is equipped with a Y interferometer 18Y which irradiates a plurality of measurement beams in the Y-axis direction on reflection surface 17a of wafer table WTB, and an X interferometer which irradiates one or more than one measurement beams parallel to the X-axis direction on reflection surface 17b, and this X interferometer includes a plurality of, in the embodiment, two X interferometers $18X_1$ and $18X_2$.

The substantial measurement axis n the Y-axis direction of Y interferometer 18Y is a straight line in the Y-axis direction which passes through optical axis AX of projection optical system PL and the detection center of alignment system ALG which will be described later on. Y interferometer 18Y measures the positional information of wafer table WTB in the Y-axis direction and the θz direction (and the θx direction).

Further, the substantial measurement axis in the X-axis direction of X interferometer $18X_1$ is a straight line in the X-axis direction which passes through optical axis AX of projection optical system PL. X interferometer $18X_1$ measures the positional information of wafer table WTB in the X-axis direction and the θz direction (and the θy direction).

Further, the measurement axis of X interferometer $18X_2$ is a straight line in the X-axis direction which passes through the detection center of alignment system ALG. X interferometer $18X_1$ measures the positional information of wafer table WTB in the X-axis direction (and the θy direction).

Incidentally, instead of reflection surfaces 17a and 17b, for example, a movable mirror consisting of a plane mirror can be attached to the end of wafer table WTB. Further, a reflection surface inclined at an angle of 45 degrees to the XY plane can be arranged on wafer table WTB, and the position of wafer table WTB in the Z-axis direction can be measured via the reflection surface.

The measurement values of each of the interferometers of interferometer system 18 are supplied to main controller 20. In the embodiment, however, positional information (including information on the θz rotation quantity) of wafer stage WST (wafer table WTB) within the XY plane is mainly measured by encoder system 70 previously described, and the measurement values of interferometers 18Y, 18X1, and 18X2 are secondarily used in cases such as when long-term fluctuation (for example, by temporal deformation or the like of the scales) of the measurement values of encoder system 70 is corrected (calibrated), or as backup at the time of output abnormality in the encoder system. Further, in the embodiment, main controller 20 computes the positional information of wafer stage WST (water table WTB) within the XY plane based on measurement values of each of the interferometers of wafer interferometer system 18 at a predetermined sampling interval (an interval which is much shorter than a generation timing of a control clock for controlling the position of wafer stage WST) when controlling the position of wafer stage WST (wafer table WTB) within the XY plane by encoder system 70, and based on the computation results, judges whether or not any one of the four heads 60A to 60D is located within liquid immersion area ALq. More specifically, in the embodiment, the measurement values of each of the interferometers of water interferometer system 18 are used not only secondarily for the purpose previously described, but also to judge that a head has entered into the liquid immersion area.

Alignment system ALG is an alignment system of an off-axis method placed on the −Y side of projection optical system PL away by a predetermined distance, as shown in FIGS. 1 and 2. In the embodiment, as alignment system ALG, as an example, an FIA (Field Image Alignment) system is used which is a type of an alignment sensor by an image processing method that measures a mark position by illuminating a mark using a broadband (a wide band wavelength range) light such as a halogen lamp and performing image processing of the mark image. The imaging signals from alignment system ALG are supplied to main controller 20 (refer to FIG. 4), via an alignment signal processing system (not shown).

Incidentally, alignment system ALG is not limited to the FIA system, and an alignment sensor, which irradiates a coherent detection light to a mark and detects a scattered light or a diffracted light generated from the mark or makes two diffracted lights (for example, diffracted lights of the same order or diffracted lights being diffracted in the same direction) generated from the mark interfere and detects an interference light, can naturally be used alone or in combination as needed. As alignment system ALG, an alignment system having a plurality of detection areas like the one disclosed in, for example, U.S. Patent Application Publication No. 2008/0088843 can be employed.

Moreover, in exposure apparatus 100 of the embodiment, a multiple point focal point position detection system (hereinafter shortly referred to as a multipoint AF system) AF (not shown in FIG. 1, refer to FIG. 4) by the oblique incidence method having a similar configuration as the one disclosed in, for example, U.S. Pat. No. 5,448,332 and the like, is arranged in the vicinity of projection unit PU. Detection signals of multipoint AF system AF are supplied to main controller 20 (refer to FIG. 4) via an AF signal processing system (not shown). Main controller 20 detects positional information of the wafer W surface in the Z-axis direction at each detection point based on the detection signals of multipoint AF system AF, and performs a so-called focus leveling control of wafer W during the scanning exposure based on the detection results. Incidentally, multipoint AF system can be arranged in the vicinity of alignment system ALG and surface position information (unevenness information) of the wafer surface can be obtained beforehand at the time of wafer alignment, and at the time of exposure, the surface position information and measurement values of a different sensor (for example, an encoder, an interferometer and the like) detecting a position of the wafer table upper surface in the Z-axis direction can be used to perform the so-called focus leveling control of wafer W.

In exposure apparatus 100, furthermore, above reticle R, a pair of reticle alignment detection systems 13A and 13B (not shown in FIG. 1, refer to FIG. 4) of a TTR (Through The Reticle) method which uses light of the exposure wavelength is arranged. Detection signals of reticle alignment detection systems 13A and 13B are supplied to main controller 20 via an alignment signal processing system (not shown).

FIG. 4 is a block diagram showing a partially omitted control system related to stage control in exposure apparatus 100, along with a liquid supply device and a liquid recovery device. This control system is mainly configured of main controller 20. Main controller 20 includes a so-called microcomputer (or workstation) consisting of a CPU (Central Processing Unit), ROM (Read Only Memory), RAM (Random Access Memory) and the like, and has overall control over the entire apparatus.

In exposure apparatus 100 configured in the manner described above, on manufacturing devices, reticle alignment and baseline measurement of alignment system ALG are performed, in a procedure similar to an typical scanning stepper (a procedure disclosed in, for example, U.S. Pat. No. 5,646,413 and the like) using reticle alignment detection systems 13A and 13B, a fiducial plate (not shown) on wafer table WTB and the like previously described, and around this time, wafer alignment (Enhanced Global Alignment (EGA) which is disclosed in, for example, U.S. Pat. No. 4,780,617 and the like) and the like are performed.

Then, main controller 20 performs an exposure operation by the step-and-scan method, based on the measurement results of the baseline and the results of the wafer alignment, and a pattern of reticle R is transferred onto each of a plurality of shot areas on wafer W. The exposure operation by the step-and-scan method is performed by alternately repeating a scanning exposure operation where synchronous movement of reticle stage RST and wafer stage WST previously described is performed, and a movement (stepping) operation between shots where wafer stage WST is moved to an acceleration starting position for exposure of the shot area. Further, in exposure apparatus 100 of the embodiment, on the scanning exposure described above, illumination light IL outgoing from reticle R is projected on a sensitive layer (a resist layer) on wafer W, via liquid Lq supplied in the space between wafer W and tip lens 191 of projection optical system PL. More specifically, liquid immersion exposure is performed. This allows a pattern of reticle R to be transferred in each shot area on wafer W.

Figure 5:
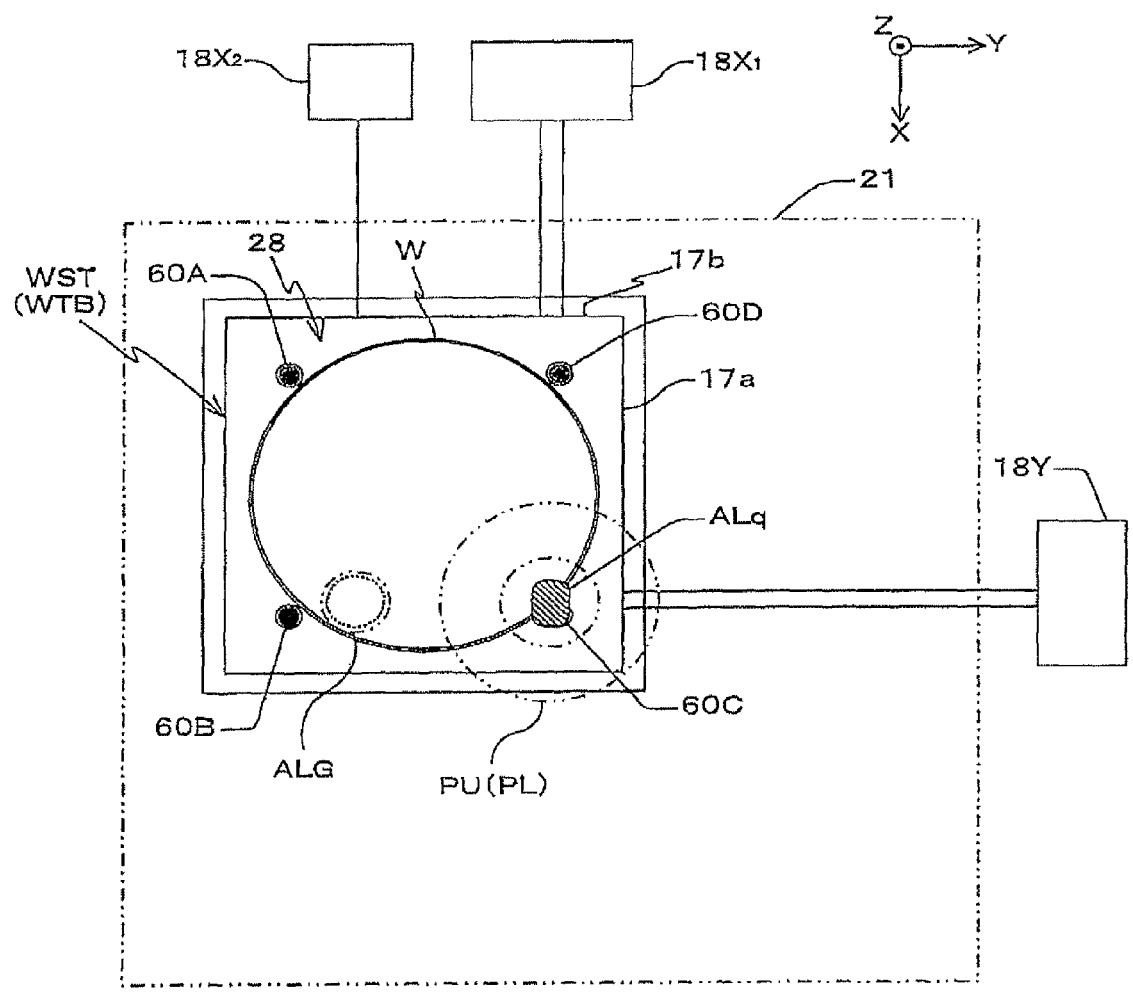
FIG. 5 is a view used to explain an operation and the like of the exposure apparatus in the first embodiment.

When a pattern is transferred on a shot area in the periphery edge of wafer W during the exposure operation by the step-and-scan method described above, liquid immersion area ALq (or a part of the area) formed on wafer W by liquid Lq may move from an area above wafer W to an area above plate 28 of wafer table WTB by the movement of wafer stage WST, and may furthermore move to the area above a head on plate 28. FIG. 5 shows a state where liquid immersion area ALq has moved right above head 60C. In the state shown in FIG. 5, a phenomenon such as the measurement beam from head 60C being interrupted, scattered, or the wavelength shortened by liquid Lq forming liquid immersion area ALq and the like may occur. Accordingly, head 60C will not function normally. In this case, if in the case head 60C was included in one of the three heads used for position control of wafer stage WST in the XY plane, the position of wafer stage WST in the XY plane cannot be controlled properly.

Therefore, in the embodiment, in order to avoid such a situation from occurring, as previously described, main controller 20 computes the positional information of wafer stage WST (wafer table WTB) within the XY plane based on measurement values of each of the interferometers of wafer interferometer system 18 at a predetermined sampling interval when controlling the position of wafer stage WST (wafer table WTB) within the XY plane by encoder system 70, and based on the computation results, judges whether or not any one of the four heads 60A to 60D is positioned within liquid immersion area ALq. And when main controller 20 judges that either one of the heads (for example, head 60C) is located within the liquid immersion area, main controller 20 performs position control of wafer stage WST in the XY plane based on the measurement values of the heads (for example, 60A, 60B, and 60D) (the encoders configured by the heads (for example, 70A, 70B, and 70C)) besides the head (for example, head 60C). More specifically, in the embodiment, main controller 20 repeatedly judges whether or not any one of the four heads is positioned within the liquid immersion area based on the measurement values of each of the interferometers of wafer interferometer system 18 at a sampling interval which is much shorter than a generation timing of a control clock for controlling the position of wafer stage WST, and in the case any of the heads was judged to be located within the liquid immersion area, the remaining three heads are promptly decided to be used in position control of wafer stage WST in the XY plane. Accordingly, as a consequence, even if one of the three heads used in the control so far is about to enter the liquid immersion area, the heads used for control is promptly switched to three heads including the remaining head which was not used in the control until then.

And, when wafer stage WST moves from the position shown in FIG. 5 and head 60C moves away from liquid immersion area ALq, head 60C comes to function properly (restores its function). Therefore, when main controller 20 confirms that liquid immersion area ALq has moved away from above head 60C, main controller 20 selects three heads out of four heads 60A to 60D (encoders 70A to 70D) and uses their measurement values to obtain the positional information of wafer table WTB (wafer stage WST). In the manner described, main controller 20 constantly performs measurement of the positional information and position control of wafer stage WST with high accuracy in a stable manner, using encoder system 70. Incidentally, because there may be a case when liquid immersion area ALq spreads during the movement of wafer table WTB (wafer stage WST), it is desirable to perform the judgment of whether or not head 60C has moved away from liquid immersion area ALq using the greatest range assumed. Or, the range of the area used in the judgment above may be changed in consideration of the speed and the like of wafer table WTB.

As described in detail above, according to exposure apparatus 100 of the embodiment, measurement of the positional information of wafer stage WST in the XY plane is performed by main controller 20, using three encoder heads which are located outside liquid immersion area ALq, out of a plurality of encoder heads 60A to 60D. This keeps the encoder head which may not function properly due to being located in liquid immersion area ALq as in output abnormality being generated from being used, which allows a measurement of the positional information and position control of wafer stage WST to be performed with high accuracy in a stable manner.

Further, according to exposure apparatus 100 of the embodiment, because main controller 20 performs position measurement and position control of wafer stage WST with high precision, using the three encoder heads that are positioned outside also during the exposure operation by the step-and-scan method, it becomes possible to transfer a pattern of reticle R on each shot area on wafer W with good precision by the liquid immersion exposure by the scanning exposure method.

Incidentally, in the embodiment above, while the case has been described where the position of wafer stage WST (wafer table WTB) was computed based on the measurement values of each of the interferometers of wafer interferometer system 18, and judgment of whether or not any one of the four heads 60A to 60D is positioned within liquid immersion area ALq was made based on the computation results, the present invention is not limited to this. For example, main controller 20 can compute the position of wafer stage WST based on positional information obtained from each of the heads of encoder system 70 used for position control of wafer stage WST, and may judge whether or not any one of the four heads 60A to 60D is positioned within liquid immersion area ALq based on the computation results. However, in such a case, because position control itself of wafer stage WST becomes difficult when one of the heads used for position control of wafer stage WST enters the liquid immersion area, it is desirable to switch (or choose from other heads) the head used for control to another head before the head actually enters the liquid immersion area.

Figure 6:
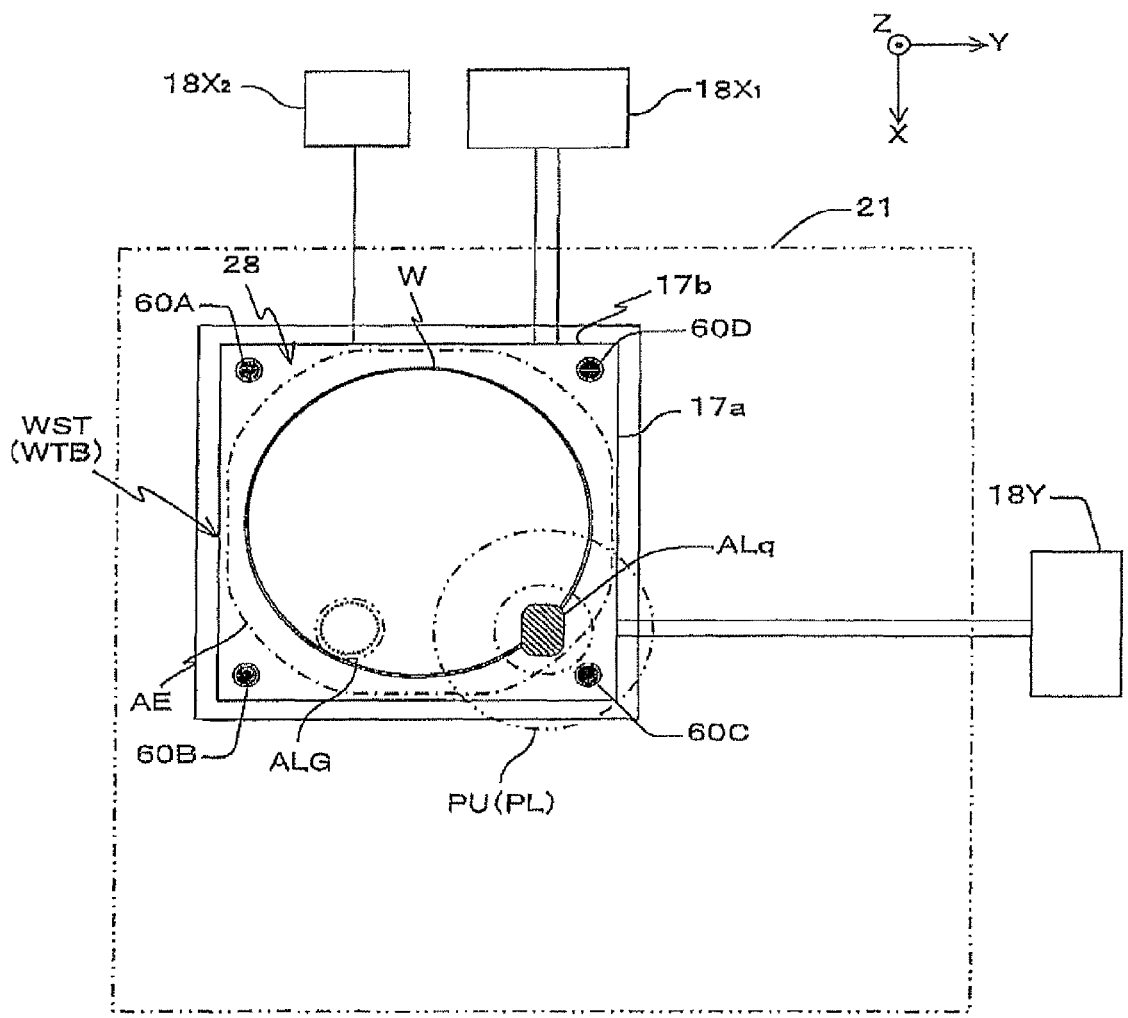
FIG. 6 is a view that shows a placement of encoder heads and interferometers of the exposure apparatus related to a modified example of the first embodiment.

Incidentally, in the embodiment above, the arrangement of heads 60A to 60D can be changed. For example, as shown in FIG. 6, heads 60A to 60D can be placed in the vicinity of the four corners (vertex) on the upper surface of wafer table WTB. The position of heads 60A to 60D in FIG. 6 is located outside an area (an area indicated by reference code AE) where liquid immersion area ALq can move on wafer table WTB and wafer W, within the normal movement range of wafer table WTE (wafer stage WST). Accordingly, in the example in FIG. 6, because neither of the head enters into liquid immersion area ALq, a highly precise and stable measurement of the positional information of wafer stage WST becomes possible constantly, using encoder system 70 which is configured using these heads. Further, in this case, operations such as monitoring the heads to see if a head enters liquid immersion area ALq, the switching of the heads due to a head entering the liquid immersion area and the like will not be required.

Incidentally, in the first embodiment described above, while the example has been described where two-dimensional diffraction grating RG was formed on the lower surface of scale plate 21, as well as this, a scale plate which has two one-dimensional diffraction gratings whose periodic direction is in the Y-axis direction and the X-axis direction, respectively, can be arranged instead of scale plate 21. In this case, the one-dimensional diffraction grating whose periodic direction is in the Y-axis direction should cover the area where Y heads 60A and 60C may face each other by the movement of wafer stage WST, and the one-dimensional diffraction grating whose periodic direction is in the X-axis direction should cover the area where X heads 60B and 60D may face each other.

Further, in the embodiment above, as each of the heads 60A to 60D (encoders 70A to 70D), while a one-dimensional encoder whose measurement direction is only in one direction (in the X-axis direction or the Y-axis direction) was employed, besides such an encoder, a two-dimensional encoder whose measurement direction is in both the X-axis direction and the Y-axis direction can also be employed. In this case, main controller 20 can obtain positional information (including information on the θz rotation quantity) of wafer table WTB (wafer stage WST) in the XY plane, using measurement values of at least two encoders (more specifically, at least two encoders which output effective measurement values) facing the lower surface of scale plate 21 on which diffraction grating RG is formed Incidentally, as a cause of output abnormality of the head, besides the entry into the liquid immersion area as is previously described, causes such as foreign material adhering on the head and interrupting the measurement beam, or malfunction occurring in the head and the like can also be considered. In the case four one-dimensional heads are provided on wafer table WTB as in the embodiment above, while it is necessary to perform measurement of the positional information of wafer stage WST within the XY plane using three heads located outside the liquid immersion area, the foreign material adhesion described above may occur in one of the three heads. In consideration of such a situation, five or more one-dimensional heads may be installed on the wafer table, as in the second embodiment below.

A Second Embodiment

Next, a second embodiment of the present invention will be described, referring to FIG. 7. Here, the same reference numerals will be used for the same or similar sections as in the first embodiment previously described, and a detailed description thereabout will be simplified or omitted.

The exposure apparatus of the second embodiment is different from exposure apparatus 100 of the first embodiment previously described in the configuration of encoder system 70 which measures the positional information of water stage WST, especially in the placement of encoder heads on wafer stage WST and the placement of scale plate 21, and as for other sections, the configuration and the like is the same. Accordingly, in the description below, the second embodiment will be described, focusing mainly on such differences.

Figure 7:
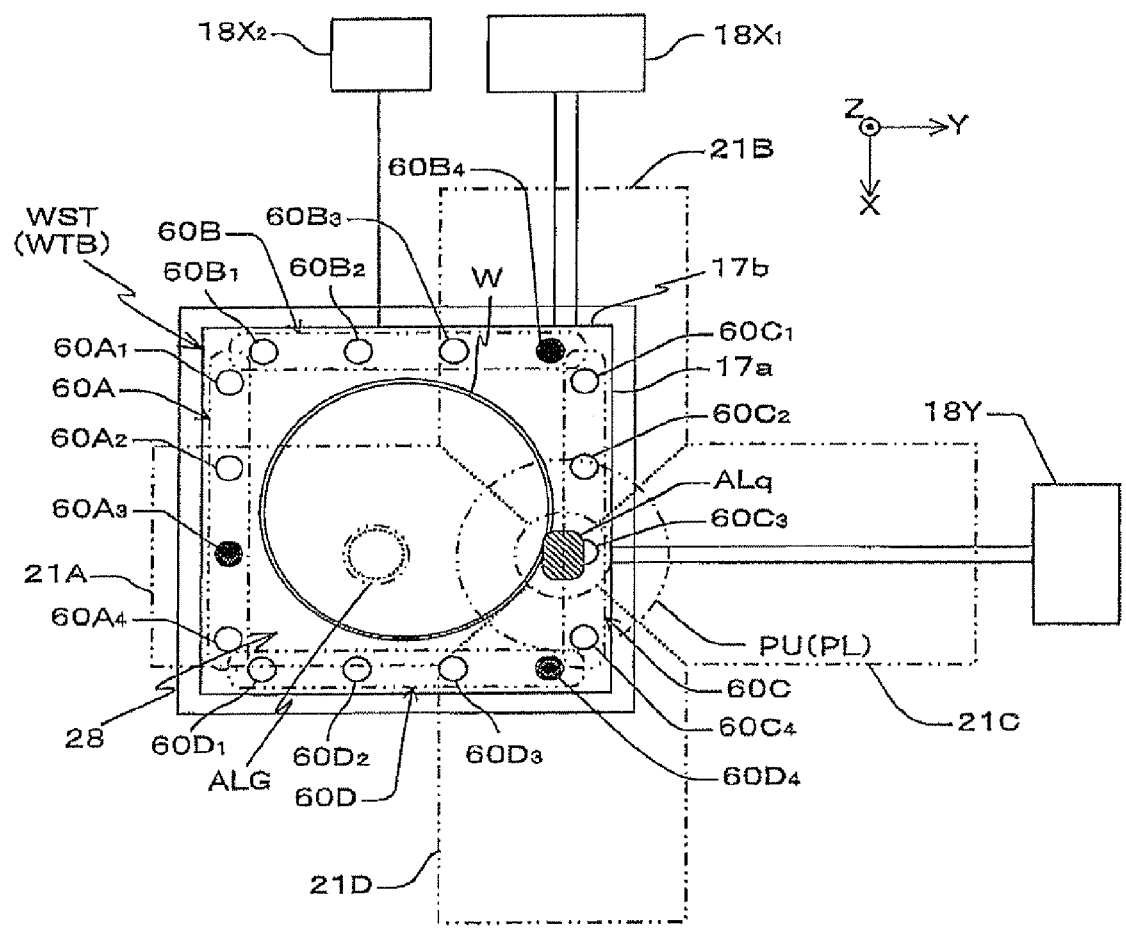
FIG. 7 is a view that shows an exposure apparatus of a second embodiment.

FIG. 7 shows a partially omitted planar view of an exposure apparatus of the second embodiment. As shown in FIG. 7, in the exposure apparatus of the second embodiment, four heads are placed along the four sides on the upper surface of wafer table WTB (wafer stage WST), respectively. More specifically, in the vicinity of one side of the upper surface of wafer table WTB on the −Y side, four heads $60A_1$ to $60A_4$ configuring a head unit 60A are placed at a predetermined distance along the side. Heads $60A_1$, $60A_2$, $60A_3$, and $60A_4$ are placed at a distance larger than the width of liquid immersion area ALq in the X-axis direction. Similarly, in the vicinity of the sides on the upper surface of wafer table WTB on the −X side, the +Y side, and the +X side, four heads $60B_1$, $60B_2$, $60B_3$, and $60B_4$ configuring a head unit 60B, four heads $60C_1$, $60C_2$, $60C_3$, and $60C_4$ configuring a head unit 60C, and four heads $60D_1$, $60D_2$, $60D_3$, and $60D_4$ configuring a head unit 60D are placed along the respective sides at a predetermined distance. The heads belonging to the same head unit are placed at a distance larger than the width of liquid immersion area ALq in the arrangement direction.

Further, in the exposure apparatus of the second embodiment, instead of scale plate 21 previously described, four scale plates 21A, 21B, 21C, and 21D which correspond to head units 60A, 60B, 60C, and 60D respectively are arranged. Scale plates 21A, 21B, 21C, and 21D are placed on the −Y side, the −X side, the +Y side, and the +X side on the lower end of projection optical system PL, respectively. On the lower surface (the surface on the −Z side) of scale plates 21A and 21C, a one-dimensional diffraction grating whose periodic direction is in the Y-axis direction is formed. Further, on the lower surface of scale plates 21B and 21D, a one-dimensional diffraction grating whose periodic direction is in the X-axis direction is formed.

Each head belonging to head units 60A, 60B, 60C, and 60D irradiates a measurement beam (measurement beams) on the corresponding scale plates 21A, 21B, 21C and 21D, respectively, and by receiving the diffraction light which occurs by the irradiation, configures an encoder (70A, 70B, 70C, and 70D) which measures positional information of wafer stage WST in each measurement direction. The width of scale plates 21A, 21B, 21C and 21D is sufficiently longer than the distance between heads adjacent to each other belonging to a corresponding head unit, and two or more heads belonging to a corresponding head unit simultaneously face a scale plate.

In the state shown in FIG. 7, three Y heads $60A_2$, $60A_3$, and $60A_4$ of the four heads belonging to head unit 60A face scale plate 21A. Further, of each of the four heads belonging to head units 60B and 60D, two X heads each, which are X heads $60B_3$ and $60B_4$, and $60D_3$ and $60D_4$ face scale plates 21B and 21D, respectively. Meanwhile, none of the four heads belonging to head unit 60C face scale plate 21C. Further, at this point, head $60C_3$ has a portion located within liquid immersion area ALq.

In this case, main controller 20 judges whether any of the heads are located within liquid immersion area ALq or not, based on positional information of wafer stage WST measured using wafer interferometer system 18 (or the encoder system 70) as is previously described, and judges that head $60C_3$ is located within liquid immersion area ALq. Then, main controller 20 further excludes the head which outputs abnormal positional information from the remaining heads besides head $60C_3$. Then, main controller 20 selects the necessary number of heads, such as, for example, three heads, from the remaining plurality of heads.

For example, in the case of FIG. 7, main controller 20 selects Y head $60A_3$ from Y heads $60A_2$, $60A_3$, and $60A_4$ facing scale plate 21A, X head ($60B_4$ from X heads $60B_3$ and $60B_4$ facing scale plate 21B, and X head $60D_4$ from X heads $60D_3$ and $60D_4$ facing scale plate 21D, respectively.

Then, main controller 20 uses the measurement values of the three heads $60A_3$, $60B_4$, and $60D_4$ (encoders 70A, 70B, and 70D) to obtain the positional information of wafer table WTB (wafer stage WST).

As described, of the plurality of heads, main controller 20 selects three heads (encoders) out of the remaining heads that exclude the head positioned within liquid immersion area Alq, and furthermore, the head which is located outside liquid immersion area ALq but outputs abnormal measurement values, and by using the measurement values of the three heads, obtains the positional information of wafer table WTB (wafer stage WST).

According to the exposure apparatus of the second embodiment which is configured and functions in the manner described above, a similar effect can be obtained as in exposure apparatus 100 of the first embodiment previously described. In addition, in the second embodiment, a head including measurement errors due to adhesion of foreign materials and the like will not be used for position control of wafer stage WST.

Incidentally, in the first and second embodiments described above, as each of the heads (encoders), while a one-dimensional encoder whose measurement direction is only in one direction (in the X-axis direction or the Y-axis direction) was employed, besides such an encoder, a two-dimensional encoder whose measurement direction is in both the X-axis direction and the Y-axis direction can also be employed as in the third embodiment below.

A Third Embodiment

Next, a third embodiment of the present invention will be described, referring to FIG. 8. Here, the same reference numerals will be used for the same or similar sections as in the first embodiment previously described, and a detailed description thereabout will be simplified or omitted.

The exposure apparatus of the third embodiment is different from exposure apparatus 100 of the first embodiment previously described in the configuration of encoder system 70 which measures the positional information of wafer stage WST, especially the encoder heads on wafer stage WST and scale plate 21, and as for other sections, the configuration and the like is the same. Accordingly, in the description below, the third embodiment will be described, focusing mainly on such differences.

Figure 8:
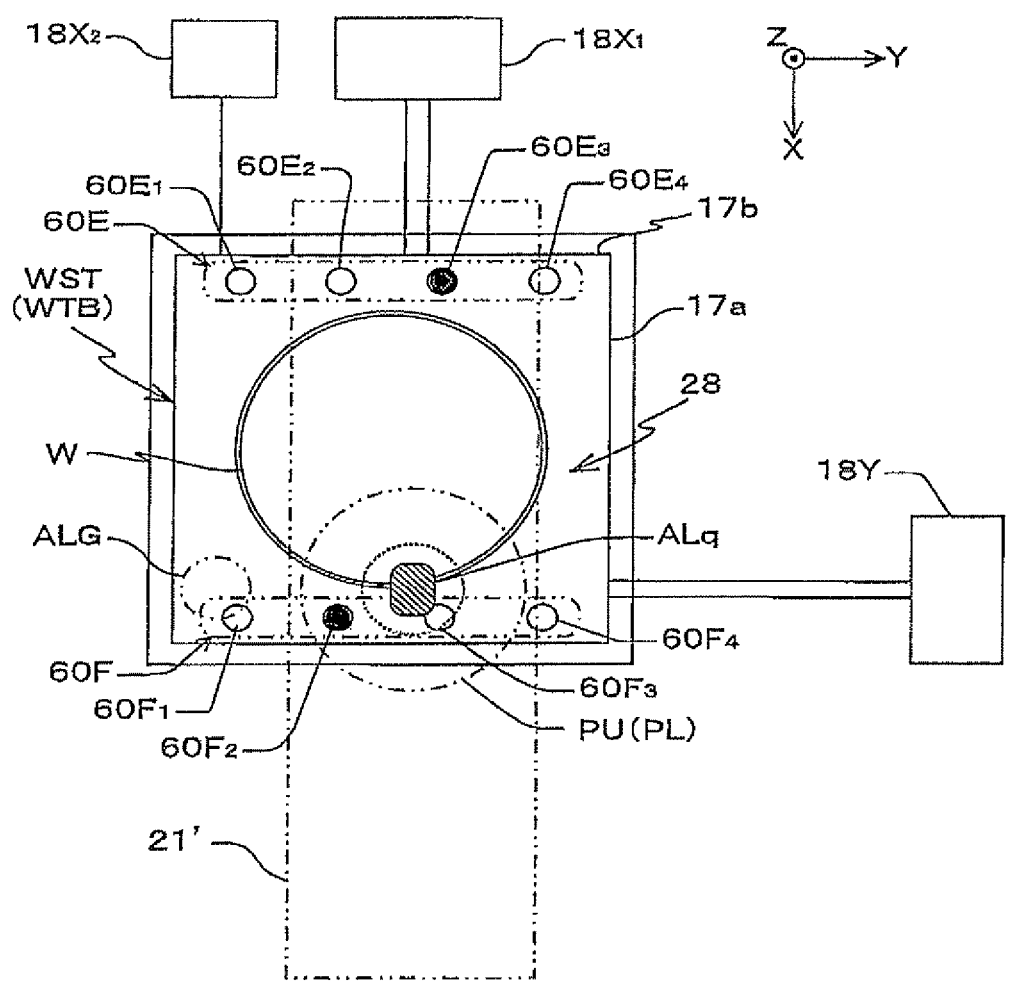
FIG. 8 is a view that shows an exposure apparatus of a third embodiment.

FIG. 8 shows a partially omitted planar view of an exposure apparatus of the third embodiment. As shown in FIG. 8, in the exposure apparatus of the third embodiment, four heads are placed along the sides on the upper surface of wafer table WTB (wafer stage WST) on the −X side and on the +X side, respectively. To enter the details, in the vicinity of a side on the −X side on the upper surface of wafer table WTB, four two-dimensional encoder heads $60E_1$, $60E_2$, $60E_3$, and $60E_4$ configuring head unit 60E are placed along the side at a predetermined distance. Similarly, in the vicinity of a side on the +X side on the upper surface of wafer table WTB, four two-dimensional encoder heads $60F_1$, $60F_2$, $60F_3$, and $60F_4$ configuring head unit 60F are placed along the side at a predetermined distance. Heads $60E_1$ to $60E_4$ and heads $60E_1$ to $60E_4$ are placed spaced apart at a separation distance larger than the width of liquid immersion area ALq in the Y-axis direction.

Further, in the exposure apparatus of the third embodiment, instead of scale plate 21 previously described, a rectangular scale plate 21' is arranged. Scale plate 21' is set at a position at the same height as scale plate 21 previously described, in a state where the center coincides with the center of projection optical system PL, and with the X-axis direction serving as the longitudinal direction. On the lower surface (the surface on the −Z side) of scale plate 21', a two-dimensional diffraction grating whose periodic direction is in the X-axis and the Y-axis directions is formed.

The heads belonging to head units 60E and 60F irradiate measurement beams (measurement beams) on scale plate 21', and by receiving the diffraction light which occurs by the irradiation, respectively configure a two-dimensional encoder which measures positional information of wafer stage WST in the X-axis and the Y-axis directions. The width of scale plate 21' in the Y-axis direction is sufficiently longer than the separation distance of the heads, and two or more heads belonging to the same head unit simultaneously face scale plate 21'.

In the state shown in FIG. 8, of the four heads belonging to head unit 60E, two heads $60E_2$ and $60E_3$, and one head $60F_2$ of the four heads belonging to head unit 60F face scale plate 21'. Further, head $60F_3$ belonging to head unit 60F is located within liquid immersion area ALq.

In this case, main controller 20 judges whether any of the heads are located within liquid immersion area ALq or not, based on positional information of wafer stage WST measured using water interferometer system 18 (or the encoder system 70) as is previously described, and judges that head $60F_3$ is located within liquid immersion area ALq. Then, main controller 20 further excludes the head which outputs abnormal positional information from the remaining heads besides head $60F_3$. Then, main controller 20 selects the necessary number of heads, such as, for example, two heads, from the remaining plurality of heads.

For example, in the case of FIG. 8, main controller 20 selects heads $60E_3$ and $60F_2$ from heads $60E_2$, $60E_3$, and $60F_2$ facing scale plate 21'.

Then, main controller 20 obtains the positional information of wafer table WTB (wafer stage WST), using the measurement values of (a pair of two-dimensional encoders configured by) these two heads $60E_3$ and $60F_2$.

As described, of the plurality of heads, main controller 20 selects three heads (encoders) out of the remaining heads that exclude the head positioned within liquid immersion area ALq, and furthermore, the head which is located outside liquid immersion area ALq but outputs abnormal measurement values, and by using the measurement values of the two heads, obtains the positional information of wafer table WTB (wafer stage WST).

According to the exposure apparatus of the third embodiment which is configured and functions in the manner described above, an equivalent effect can be obtained as in the second embodiment previously described.

Incidentally, in the second and third embodiments, of a plurality of heads, main controller 20 can select a necessary number (three or two) of heads (encoders) out of the remaining heads that exclude the head which is located within liquid immersion area ALq, and can use the measurement value thereof to obtain the positional information of wafer table WTB (wafer stage WST). On the contrary, not only the head within liquid immersion area ALq but also the head which is located in the vicinity of liquid immersion area ALq, and furthermore, the head which could enter liquid immersion area ALq can be constantly detected, and the positional information of wafer stage WST can be measured using the remaining heads which excludes these heads as well. This can further increase the stability of position measurement of wafer table WTB (wafer stage WST) using the encoder system.

Incidentally, in each of the embodiments above, while sampling was performed on the measurement values of the wafer interferometer system for switching an encoder (head), sampling does not necessarily have to be performed on the measurement values of the wafer interferometer system. Further, because movement information of the wafer stage is obvious from the exposure sequence, the timing for switching or the position of the wafer stage can be decided beforehand, and the head can be switched simply based on the matters which were decided.

Further, in each of the embodiments above, while the encoder (head) was switched using positional information of the wafer stage measured by the wafer interferometer system, the positional information measured by the wafer interferometer system does not have to be used. In this case, measurement information of an encoder used for the position measurement of the wafer stage can be used, or measurement information (positional information) by another encoder which is not used for position measurement can be used. In the latter case, the encoder (not used for position measurement) to be used can be switched according to the position of the wafer stage.

Incidentally, in the exposure apparatus in each of the embodiments above, the head exchange can be performed similarly, not only during the exposure operation but also during other operations, such as, for example, reference mark detection, or measurement using a sensor on the wafer stage (such as an uneven illumination measuring sensor, an aerial image measuring sensor, an irradiation measuring sensor, a polarization sensor, a wavefront measurement sensor and the like). However, the wafer stage will need to have at least one measurement member (such as a sensor), and a liquid immersion domain will have to be formed on the wafer stage. Further, the head exchange can be applied similarly, also in the case of measuring positional information of a measurement stage using an encoder in an exposure apparatus equipped with the measurement stage which will be described later on.

Incidentally, the placement of the encoders (heads) on the wafer stage in each of the embodiments above is a mere example, and the present invention is not limited to this. For example, an encoder and a backup encoder can be placed on each of the four corners of the wafer stage along a radial direction from the stage center.

Further, in the case of placing an encoder head on a surface of a movable body such as wafer table WTB (wafer stage WST), a main section of the head can be placed inside the movable body while only the light-receiving section is placed on the surface.

Incidentally, in each of the embodiments above, a sensor (or a head) which can measure positional information in the Z-axis direction can be used together, or a sensor (or a head) which can measure positional information in the X-axis direction and Y-axis direction, or a sensor (an X sensor) whose measurement direction is in the X-axis direction and a sensor (a Y sensor) whose measurement direction is in the Y-axis direction can be used in combination. Besides this, an encoder which can measure positional information in at least one of the X-axis direction and the Y-axis direction, and the Z-axis direction can also be used.

Further, for example, in an exposure apparatus whose projection optical system and alignment system are spaced apart, different scale plates can be provided in the vicinity (periphery) of the projection optical system and in the vicinity (periphery) of the alignment system. In this case, when exposure operation of wafer W is performed, the position of the wafer stage is measured by the encoder system, using the scale board placed in the vicinity of the projection optical system, and on wafer alignment and the like, the position of the wafer stage is measured by the encoder system, using the scale board placed in the vicinity of the alignment system.

Further, in the embodiment above, while the case has been described where a wafer interferometer system was arranged in addition to the encoder system, the wafer interferometer system does not necessarily have to be arranged.

Incidentally, in each of the embodiments above, the case has been described where the present invention is applied to a scanning stepper; however, the present invention is not limited to this, and can also be applied to a static exposure apparatus such as a stepper. Even if the present invention is applied to a stepper, by measuring the position of the stage on which the object subject to exposure is mounted using an encoder, position measurement error caused by air fluctuation can substantially be nulled, which is different from when measuring the position of the stage using an interferometer, and it becomes possible to position the stage with high precision based on the measurement values of the encoder, which in turn makes it possible to transfer a reticle pattern on the object with high precision. Further, the present invention can also be applied to a reduction projection exposure apparatus by a step-and-stitch method that synthesizes a shot area and a shot area.

Moreover, the present invention can also be applied to a multi-stage type exposure apparatus equipped with a plurality of wafer stages, as is disclosed in, for example, the U.S. Pat. No. 6,590,634 description, the U.S. Pat. No. 5,969,441 description, the U.S. Pat. No. 6,208,407 description and the like. Further, the present invention can also be applied to an exposure apparatus equipped with a measurement stage including a measurement member (for example, a reference mark, and/or a sensor and the like) different from the wafer stage, as disclosed in, for example, International Publication No. 2005/074014.

Further, the magnification of the projection optical system in the exposure apparatus of each of the embodiments above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image.

Further, illumination light IL is not limited to an ArF excimer laser beam (wavelength 193 nm), and can also be an ultraviolet light such as the KrF excimer laser beam (wavelength 248 nm), or a vacuum-ultraviolet light such as the $F_2$ laser beam (wavelength 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in each of the embodiments above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, because the stage where a wafer, a glass plate or the like is mounted is scanned with respect to the variable shaped mask, an equivalent effect as each of the embodiments above can be obtained by measuring the position of the stage using an encoder.

Further, as is disclosed in, for example, International Publication No. 2001/035168, the present invention can also be applied to an exposure apparatus (lithography system) that forms line-and-space patterns on a wafer W by forming interference fringes on water W.

Moreover, as disclosed in, for example, U.S. Pat. No. 6,611,316, the present invention can also be applied to an exposure apparatus that synthesizes two reticle patterns via a projection optical system and almost simultaneously performs double exposure of one shot area by one scanning exposure.

Incidentally, an object on which a pattern is to be formed (an object subject to exposure to which an energy beam is irradiated) in each of the embodiments above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for transferring a liquid crystal display device pattern onto a rectangular glass plate, and an exposure apparatus for producing organic ELs, thin-film magnetic heads, imaging devices (such as CCDs), micro-machines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Incidentally, the disclosures of all of the publications (including the International Publications), the U.S. Patent Application Publication descriptions and the U.S. patent descriptions that are cited in the description so far related to exposure apparatuses and the like are each incorporated herein by reference.

Incidentally, semiconductor devices are manufactured through the steps of; a step where the function/performance design of the device is performed, a step where a reticle based on the design step is manufactured, a step where a wafer is manufactured from silicon materials, a lithography step where the pattern formed on a mask is transferred onto an object such as the wafer by the exposure apparatus in the embodiment above, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, because the exposure apparatus in the embodiment above is used in the lithography step, devices having high integration can be produced with good yield.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus comprising:
   a movable body which holds a mounted object and substantially moves along a predetermined plane;
   a liquid supply device which supplies liquid on a surface of at least one of the object and the movable body on which the object is mounted;
   a pattern generation device which includes an optical system that has liquid supplied to a space formed with the surface of at least one of the object and the movable body, and which irradiates an energy beam on the object via the optical system and the liquid, and forms a pattern on the object; and
   a measurement system which has a plurality of encoder heads each placed on a surface of the movable body that is parallel to the predetermined plane, and out of the plurality of encoder heads, measures positional information of the movable body, based on measurement values of a predetermined number of encoder heads that face a grating section placed outside the movable body and in parallel to the predetermined plane, wherein
   when some of the plurality of encoder heads are located in a liquid immersion area formed with the liquid, the measurement system measures the positional information of the movable body based on measurement values of a predetermined number of encoder heads located outside the liquid immersion area.

2. The exposure apparatus according to claim 1 wherein the measurement system selects and uses an encoder head outside the liquid immersion area from the plurality of encoder heads, based on positional information of the movable body within the predetermined plane.

3. The exposure apparatus according to claim 2 wherein the plurality of encoder heads is placed spaced apart at a separation distance larger than a width of the liquid immersion area.

4. The exposure apparatus according to claim 2 wherein the movable body is made of a member having a rectangular shape in a planar view, and each of the plurality of encoder heads is placed in each of four corners of the movable body.

5. The exposure apparatus according to claim 2 wherein the movable body is made of a member having a rectangular shape in a planar view, and the plurality of encoder heads is placed along at least one of four sides of the movable body.

6. The exposure apparatus according to claim 1 wherein the plurality of encoder heads includes a first head and a second head whose measurement directions are in a first direction and a second direction, respectively, which are orthogonal to each other in the predetermined plane, and the measurement system uses at least a total of three encoder heads including one each of the first and second heads.

7. The exposure apparatus according to claim 6 wherein the grating section includes
   a first diffraction grating which covers a range where the first head faces and which has a periodic direction in the first direction; and
   a second diffraction grating which covers a range where the second head faces and which has a periodic direction in the second direction.

8. The exposure apparatus according to claim 6 wherein the grating section includes a two-dimensional grating which covers a range where the first and second heads face and which has a periodic direction in the first and second directions.

9. The exposure apparatus according to claim 1 wherein the plurality of encoder heads includes a two-dimensional head whose measurement directions are in both a first direction and a second direction, which are orthogonal to each other in the predetermined plane, and
   the measurement system uses at least two of the two-dimensional heads.

10. The exposure apparatus according to claim 9 wherein the grating section includes a two-dimensional grating which covers a range where the two-dimensional head faces and which has a periodic direction in the first and second directions.

11. The exposure apparatus according to claim 1 wherein the surface of the movable body is covered with a light transmission member which forms a substantially flush surface with the object with a small gap in between, and covers the plurality of encoder heads.

12. The exposure apparatus according to claim 1 wherein of the plurality of encoder heads which are outside the liquid immersion area, the measurement system uses remaining encoder heads that exclude an encoder head which outputs abnormal positional information.

13. The exposure apparatus according to claim 1, further comprising:
   a drive system which drives the movable body based on positional information of the movable body within the predetermined plane.

14. A device manufacturing method comprising:
   exposing an object with the exposure apparatus according to claim 1; and developing the object which has been exposed.

15. An exposure method in which an energy beam is irradiated on an object via an optical system and liquid, and a pattern is formed on the object, the method comprising:
   a measurement process in which, of a plurality of encoder heads that are placed on a surface, where the object is mounted, of a movable body that substantially moves along a predetermined plane, positional information of the movable body is measured based on measurement values of a predetermined number of encoder heads that face a grating section placed outside the movable body and in parallel with the predetermined plane, the surface of the movable body being parallel to the predetermined plane, wherein
   when some of the plurality of encoder heads are located in a liquid immersion area formed with the liquid, the positional information of the movable body is measured based on measurement values of a predetermined number of encoder heads located outside the liquid immersion area.

16. The exposure method according to claim 15 wherein the plurality of encoder heads includes a first head and a second head whose measurement directions are in a first direction and a second direction, respectively, which are orthogonal to each other in the predetermined plane, and in the measurement process, at least a total of three encoder heads including one each of the first and second heads are used.

17. The exposure method according to claim 15 wherein the plurality of encoder heads includes a two-dimensional head whose measurement directions are in both a first direction and a second direction, which are orthogonal to each other in the predetermined plane, and in the measurement process, at least two of the two-dimensional heads are used.

18. The exposure method according to claim 15 wherein in the measurement process, of the plurality of encoder heads which are outside the liquid immersion area, remaining encoder heads that exclude an encoder head which outputs abnormal positional information are used.

19. The exposure method according to claim 15, further comprising:

a drive process in which the movable body is driven based on positional information of the movable body within the predetermined plane.

20. A device manufacturing method comprising:

a process in which a pattern is formed on the object by the exposure method according to claim 15; and a process in which the object on which the pattern has been formed is developed.

\* \* \* \* \*